United States Patent
Yang et al.

(10) Patent No.: US 10,354,736 B1
(45) Date of Patent: Jul. 16, 2019

(54) MEMORY FAILURE DETECTION AND RESOURCE ALLOCATION

(71) Applicant: Western Digital Technologies, Inc., San Jose, CA (US)

(72) Inventors: Nian Niles Yang, Mountain View, CA (US); Pitamber Shukla, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/966,724

(22) Filed: Apr. 30, 2018

(51) Int. Cl.
  *G11C 16/04* (2006.01)
  *G11C 16/34* (2006.01)
  *G06F 11/07* (2006.01)
  *G06F 11/00* (2006.01)
  *G11C 16/14* (2006.01)

(52) U.S. Cl.
  CPC ........ *G11C 16/3404* (2013.01); *G06F 11/008* (2013.01); *G06F 11/0727* (2013.01); *G11C 16/14* (2013.01)

(58) Field of Classification Search
  CPC ... G11C 16/3404; G11C 16/14; G06F 11/008; G06F 11/0727
  USPC ........................................ 365/185.01–185.33
  See application file for complete search history.

(56) References Cited

U.S. PATENT DOCUMENTS

| 6,532,170 B1 * | 3/2003 | Madurawe | G11C 5/00 365/185.05 |
| 7,369,438 B2 * | 5/2008 | Lee | G11C 11/005 257/E27.103 |
| 2008/0205141 A1 * | 8/2008 | Lee | G11C 11/5671 365/185.03 |

* cited by examiner

*Primary Examiner* — Harry W Byrne
(74) *Attorney, Agent, or Firm* — Arent Fox LLP

(57) ABSTRACT

The present disclosure is directed to a device, a method, and a non-transitory computer readable medium for determining a level of uncertainty of programmed states of memory cells. In one aspect, a memory device includes memory cells, an uncertainty prediction circuit coupled to the memory cells, and a data conversion circuit coupled to the memory cells. The uncertainty prediction circuit is configured to determine, from a subset of the memory cells coupled to a word line, a number of memory cells having a predetermined state. The data conversion circuit is configured to apply a data conversion to a portion of data stored by the subset of the memory cells, in response to the uncertainty prediction circuit determining that the number of memory cells is between a first threshold and a second threshold.

20 Claims, 9 Drawing Sheets

MEMORY FAILURE DETECTION AND RESOURCE ALLOCATION

BACKGROUND

The following description is provided to assist the understanding of the reader. None of the information provided is admitted to be prior art.

Data stored by memory devices may be subject to errors. Due to unexpected power loss, abnormal shutdown of a computing device, or aging of a memory device, data stored by the memory device may be corrupted. For example, if unexpected power loss occurs while writing data to a row of memory cells, data may not be correctly stored by the memory cells in the row. Similarly, if unexpected power loss occurs while erasing data stored by a row of the memory cells, data may not be correctly erased at the row of the memory cells.

In one approach, detecting corrupted data includes analyzing each row of memory cells in a block until a row of memory cells storing incorrect data is detected. If the row of memory cells storing incorrect data is detected, then data stored by preceding rows of memory cells may be transferred to memory cells in a different block, and the entire block including the detected row of memory cells may be prevented from further use. However, this approach of preventing the entire block in response to detecting a row of memory cells storing incorrect data may render inefficient storage usage of the memory device.

SUMMARY

Various embodiments disclosed herein are related to a memory device. The memory device includes memory cells, an uncertainty prediction circuit coupled to the memory cells and a data conversion circuit coupled to the memory cells. The uncertainty prediction circuit is configured to determine, from a subset of the memory cells coupled to a word line, a number of memory cells having a predetermined state. The data conversion circuit is configured to apply a data conversion to a portion of data stored by the subset of the memory cells, in response to the uncertainty prediction circuit determining that the number of memory cells is between a first threshold and a second threshold.

In one or more embodiments, the memory device further includes an additional data conversion circuit coupled to the memory cells. The additional data conversion circuit may be configured to apply a different data conversion to the portion of the data stored by the subset of the memory cells, in response to the uncertainty prediction circuit determining that the number of memory cells is between the second threshold and a third threshold.

In one or more embodiments, the predetermined state of a memory cell indicates that the memory cell is erased. The memory device may further include a memory status indication circuit coupled to the uncertainty prediction circuit. The memory status indication circuit may be configured to, in response to the uncertainty prediction circuit determining that the number of memory cells is less than the first threshold, generate a status indicator indicating that the subset of the memory cells is programmable. The memory status indication circuit may be configured to, in response to the uncertainty prediction circuit determining that the number of memory cells is more than a third threshold, generate a status indicator indicating that the memory cells in a block are not programmable.

In one or more embodiments, each memory cell is configured to store a first page data, a second page data, and a third page data, the portion of the data stored by the subset of the memory cells being the third page data stored by the subset of the memory cells. The data conversion circuit may be configured to apply the data conversion by performing, for each memory cell in the subset of the memory cells, an XOR operation on the first page data and the second page data to substitute the third page data of the memory cell.

In one or more embodiments, the memory device further includes an additional data conversion circuit coupled to the memory cells. The additional data conversion circuit may be configured to reset the third page data stored by the subset of the memory cells, in response to the uncertainty prediction circuit determining that the number of memory cells is between the second threshold and a third threshold higher than the second threshold.

In one or more embodiments, the memory device further includes a memory state distribution analysis circuit coupled to the memory cells. The memory state distribution analysis circuit may be configured to determine a distribution of memory states of another subset of the memory cells coupled to another word line, the another subset of the memory cells adjacent to the subset of the memory cells. The memory state distribution analysis circuit may be further configured to determine another distribution of memory states of the subset of the memory cells coupled to the word line. The uncertainty prediction circuit may be configured to determine, from the subset of the memory cells coupled to the word line, the number of memory cells having the predetermined state, in response to the memory state distribution analysis circuit determining that (i) the distribution of the memory states of the another subset of the memory cells is substantially equal to a predetermined distribution, and (ii) the another distribution of the memory states of the subset of the memory cells is different from the predetermined distribution.

Various embodiments are related to a memory device. The memory device includes a status detection circuit coupled to memory cells. The status detection circuit may be configured to detect a status indicator of a subset of the memory cells, in response to receiving an instruction to read data stored by the subset of the memory cells. The memory device may further include a first data conversion circuit coupled to the memory cells and the status detection circuit. The first data conversion circuit may be configured to apply a first data conversion to a portion of data stored by the subset of the memory cells, in response to the status indicator being a first level uncertainty indicator associated with the subset of the memory cells. The first level uncertainty indicator may indicate a level of uncertain of data stored by the subset of the memory cells being between a first threshold and a second threshold. The memory device may further include a second data conversion circuit coupled to the memory cells and the status detection circuit. The second data conversion circuit may be configured to apply a second data conversion to the portion of the data stored by the subset of the memory cells, in response to the status indicator being a second level uncertainty indicator associated with the subset of the memory cells. The second level uncertainty indicator may indicate the level of uncertain of data stored by the subset of the memory cells being between the second threshold and a third threshold.

Various embodiments are related to a method for operating memory cells. A method includes determining a level of uncertainty of programmed states of a first subset of memory cells coupled to a first word line. The method further includes, in response to a determination that the level of the uncertainty of the programmed states of the first subset of the memory cells coupled to the first word line satisfies a first threshold but not a second threshold, generating a status indicator indicating that a second subset of the memory cells coupled to a second word line is programmable. The method further includes, in response to the status indicator indicating that the second subset of the memory cells coupled to the second word line is programmable, storing data in the second subset of the memory cells coupled to the second word line In one or more embodiments, determining the level of the uncertainty of the programmed states includes determining, from the first subset of the memory cells coupled to the first word line, a number of memory cells having a predetermined state.

In one or more embodiments, the method further includes applying a data conversion to a portion of data stored by the first subset of the memory cells coupled to the first word line to read the data stored by the first subset of the memory cells, in response to the uncertainty of the programmed states satisfying the first threshold but not the second threshold. The method may further include applying a different data conversion to the portion of the data stored by the first subset of the memory cells coupled to the first word line to read the data stored by the first subset of the memory cells, in response to the uncertainty of the programmed states satisfying the second threshold but not a third threshold.

In one or more embodiments, the method further includes generating another status indicator indicating that the first subset of the memory cells coupled to the first word line is programmable, in response to the uncertainty of the programmed states not satisfying the first threshold.

In one or more embodiments, the method further includes generating another status indicator indicating that the first subset of the memory cells coupled to the first word line is not programmable, in response to the uncertainty of the programmed states satisfying a third threshold.

In one or more embodiments, each memory cell stores a first page data, a second page data, and a third page data. The first page data, the second page data, and the third page data may collectively represent a memory state of the memory cell.

In one or more embodiments, the method further includes performing, for each memory cell in the first subset of the memory cells coupled to the first word line, an XOR operation on the first page data and the second page data to substitute the third page data of the memory cell, in response to the level of the uncertainty of the programmed states satisfying the first threshold but not the second threshold.

In one or more embodiments, the method further includes resetting, for each memory cell in the subset of the memory cells coupled to the first word line, the third page data, in response to the level of the uncertainty of the programmed states satisfying the second threshold but not a third threshold.

In one or more embodiments, the method further includes determining a distribution of memory states of a third subset of the memory cells coupled to a third word line, the first word line disposed between the second word line and the third word line. The method may further include determining another distribution of memory states of the first subset of the memory cells coupled to the first word line. The level of the uncertainty of the programmed states of the first subset of the memory cells coupled to the first word line may be determined in response to (i) the distribution of the memory states of the third subset of the memory cells coupled to the third word line being substantially equal to a predetermined distribution, and (ii) the another distribution of the memory states of the first subset of the memory cells coupled to the first word line being different from the predetermined distribution.

The foregoing summary is illustrative and is not intended to be in any way limiting. In addition to the illustrative aspects, embodiments, and features described above, further aspects, embodiments, and features will become apparent by reference to the following drawings and the detailed description.

DETAILED DESCRIPTION

Various embodiments disclosed herein are related to a device, a method, and a non-transitory computer readable medium for determining a level of uncertainty of programmed states of data stored by memory cells, and allocating storage resource of the memory cells according to the determined level of uncertainty of programmed states. In one or more embodiments, a memory device includes memory cells in one or more blocks, an uncertainty prediction circuit coupled to the memory cells, and a data conversion circuit coupled to the memory cells. The uncertainty prediction circuit determines a level of uncertainty of data stored by a subset of the memory cells coupled to a word line. The data conversion circuit applies a data conversion to a portion of the subset of the memory cells, in response to the uncertainty prediction circuit determining that the level of the uncertainty of the subset of the memory cells is between a first threshold and a second threshold. In one aspect, a level of uncertainty of the subset of the memory cells below the first threshold indicates that the subset of the memory cells is predicted to store correct data. In another aspect, a level of uncertainty of the subset of the memory cells above the second threshold indicates that the subset of the memory cells is predicted to store incorrect data.

In one or more embodiments, when the uncertainty of the subset of the memory cells is between the first threshold and the second threshold, a data conversion may be performed to substitute a portion of data stored by the subset of the memory cells, and other subsets of the memory cells in the block may continue to store their original data. Accordingly, storage usage of the memory device can be improved by performing the data conversion on the portion of the data stored by the subset of the memory cells rather than preventing an entire block of the memory cells from use.

Although the principle disclosed herein is described in terms of operating a memory device, this principle can be applied to other devices (e.g., a display panel, a touch sensing panel, etc.) other than a memory device.

Figure 1:
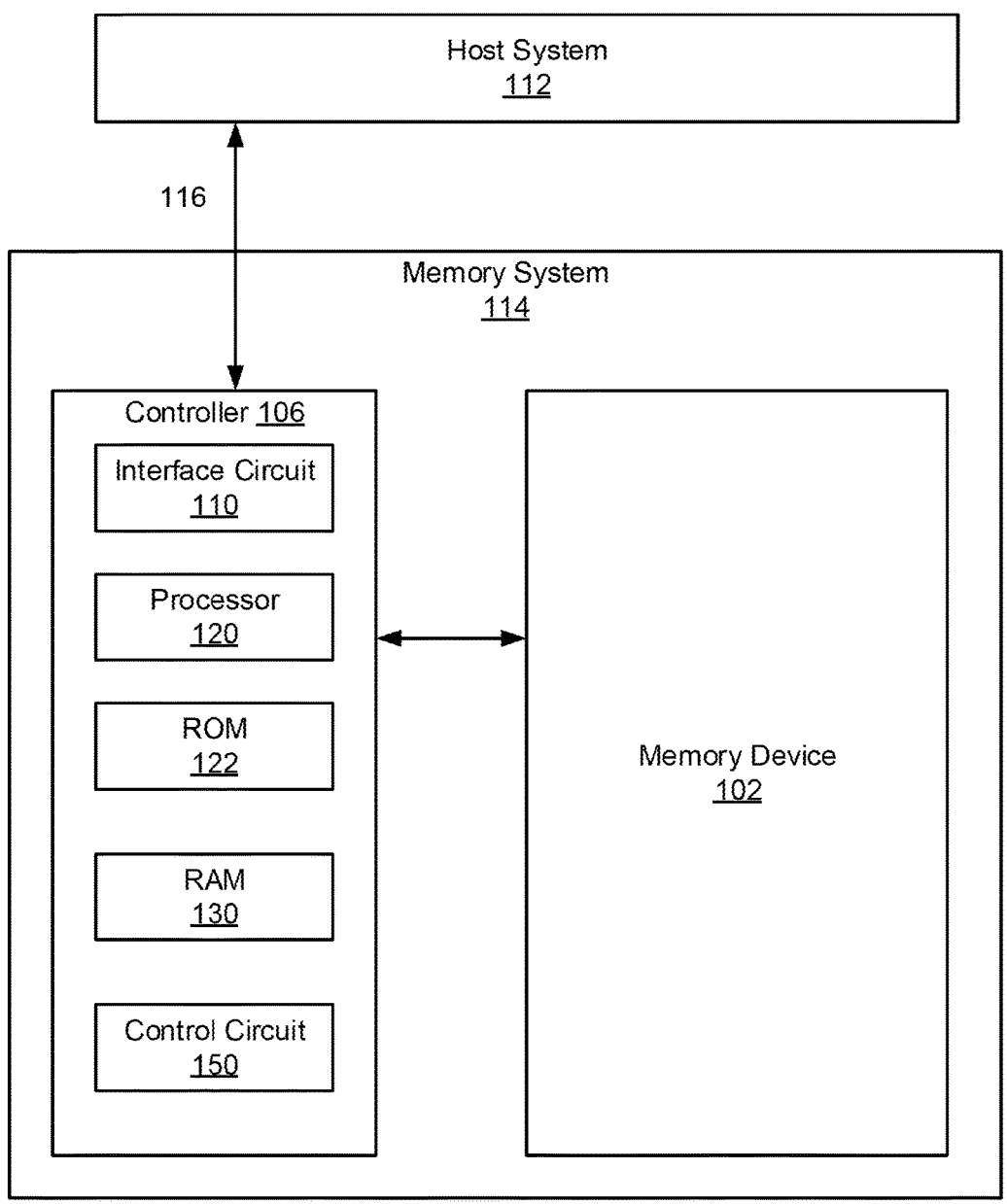
FIG. 1 is a block diagram of a computer system according to an example embodiment.

Referring to FIG. 1, illustrated is a block diagram of a computer system 100, according to an example embodiment. The computer system 100 includes a memory system 114 typically operating according to commands from a host system 112. The computer system 100 can be any electronic device such as a personal computer, a server computer, a laptop, a smart phone, a tablet computer, a smart watch, etc. The memory system 114 communicates with the host system 112 through a host interface 116. The memory system 114 may be in the form of a removable memory such as a memory card, or may be in the form of an embedded memory system.

The memory system 114 includes a memory device 102 and a controller 106. The controller 106 controls operations of the memory device 102, according to commands from the host system 112. The memory device 102 comprises one or more arrays of non-volatile memory cells distributed over one or more integrated circuit chips. The controller 106 may include interface circuit 110, processor 120, read-only-memory (ROM) 122, random access memory (RAM) 130, and a control circuit 150. The controller 106 may be embodied as an application specific integrated circuit, field programmable gate array, other controller embodiments known to those of ordinary skill in the art, or a combination of one or more of these implementations. Through the interface circuit 110, the controller 106 may communicate with the host system 112. In one aspect, the ROM 122, the RAM 130, or a combination of them stores instructions when executed by the processor 120 cause the processor 120 to execute various functions disclosed herein. In one aspect, the ROM 122, the RAM 130, a flash memory, or any combination of them constitutes a non-transitory computer readable medium. The control circuit 150 is a circuit that determines a level of uncertainty of programmed states of data stored by the memory device 102, and allocates storage resource of the memory device 102 according to the determined level of uncertainty. Detailed implementations and operations of the control circuit 150 are provided below with respect to FIGS. 5 through 10.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory devices can be formed from passive and/or active elements, in any combinations. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may contain memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein.

Figure 2:
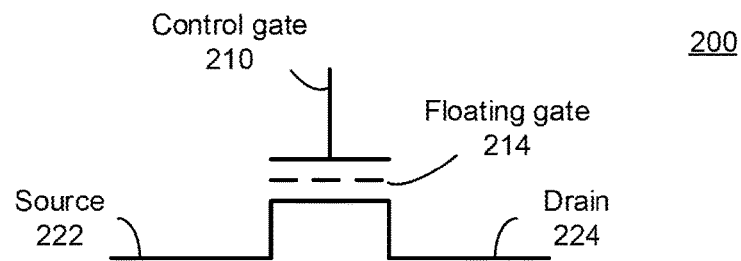
FIG. 2 is a circuit representation of a memory cell according to an example embodiment.

FIG. 2 is a circuit representation of a memory cell 200 of the memory device 102. The memory cell 200 can be implemented by a field-effect transistor having a floating gate 214 or a charge trapping (dielectric) layer. The memory cell 200 also includes a source terminal 222, a drain terminal 224, and a control gate terminal 210.

Programming a memory cell 200 may be performed by storing charges at the floating gate 214. In one approach, a hot electron injection technique is used to program the memory cell 200. Hot electron injection results from an accelerating potential built up in the substrate. When an electron having an energy greater than the energy barrier (e.g., 3.1 eV for silicon) is applied, the electron passes into the floating gate 214. One method to provide hot electron injection is by having a forward-biased PN junction in the well. Electron injection can be achieved by applying, for example, a voltage which is greater than the energy barrier (e.g., 3.1 eV). The electric field accelerates the electrons to a sufficient energy to reach the floating gate 214 of the memory cell. According to the charges stored by the floating gate 214, a threshold voltage of the memory cell 200 may change.

Reading a state of a memory cell 200 may be performed by sensing the conduction current across the source terminal 222 and drain terminal 224 when a reference voltage is applied to the control gate terminal 210. The memory cell 200 may conduct current by turning on the memory cell 200. Turning on the memory cell 200 may include applying a voltage to a gate terminal of the memory cell 200. According to a threshold of the memory cell 200, or charges on the floating gate 214, a corresponding conduction current with respect to a fixed reference control gate voltage may be detected. Similarly, the range of charge programmable onto the floating gate 214 defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (e.g., a cell-read reference current). In one implementation the detection of the conduction current relative to a threshold current is accomplished by examining the rate of the conduction current discharging through the capacitance of the bit line.

Figure 3:
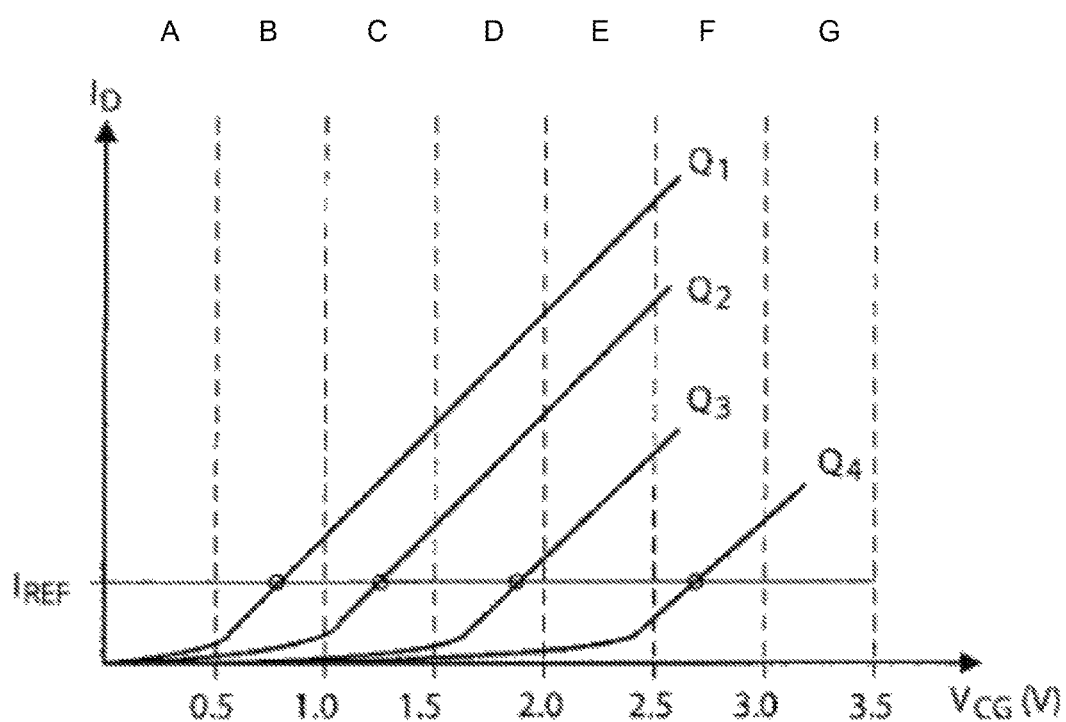
FIG. 3 is a plot illustrating a relation between a source-drain current and a control gate voltage, according to a charged stored by a floating gate of the memory cell of an example embodiment.

FIG. 3 illustrates the relationship between the source-drain current $I_D$ and the control gate voltage $V_{CG}$ for four different charges Q1-Q4 that the floating gate 214 may be selectively storing at any one time. With fixed drain voltage bias, the four solid $I_D$ versus $V_{CG}$ curves represent four of seven possible charge levels that can be programmed on a floating gate 214 of a memory cell, respectively corresponding to four possible memory states. As an example, the threshold voltage window of a population of cells may range from 0.5V to 3.5V. Seven possible programmed memory states "A", "B", "C", "D", "E", "F", "G", and an erased state (not shown) may be demarcated by partitioning the threshold window into regions in intervals of 0.5V each. For example, if a reference current, $I_{REF}$ of 2 µA is used as shown, then the cell programmed with $Q_1$ may be considered to be in a memory state "A" since its curve intersects with $I_{REF}$ in the region of the threshold window demarcated by $V_{CG}$ between 0.5V and 1.0V. Similarly, Q4 is in a memory state "F".

In one aspect, each cell stores two or more pages of data. If a memory cell is capable of storing one of eight different memory states (including the erased state), then the memory state may be represented in three binary bits, where each bit corresponds to a corresponding page data. In one example configuration, "110" represents upper page data "1", middle page data "1", and lower page data "0". Accordingly, a single cell may store multiple bits of data.

Figure 4:
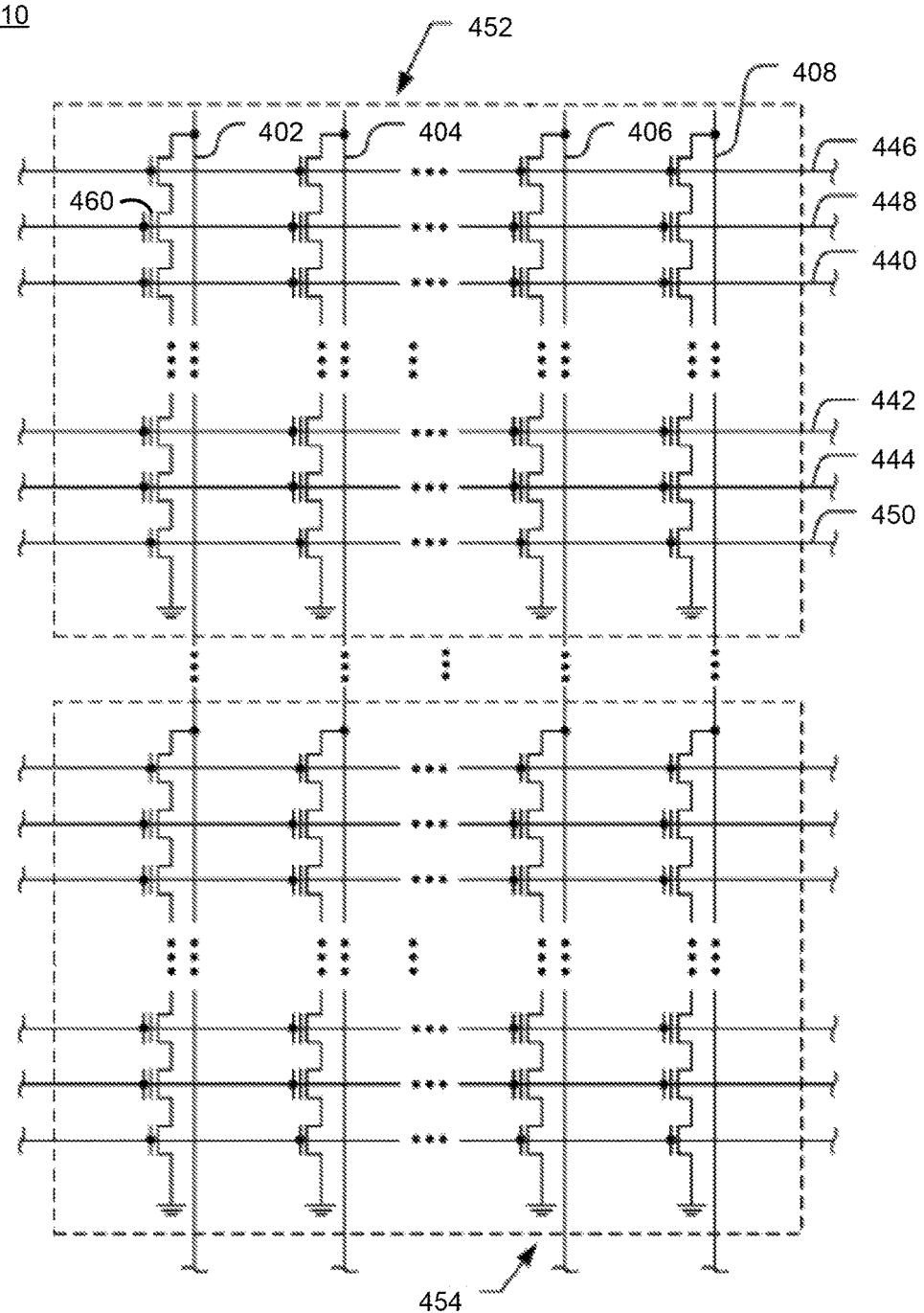
FIG. 4 is a representative circuit diagram of NAND strings according to an example embodiment.

Referring FIG. 4, illustrated are NAND strings 410, according to an example embodiment. The NAND strings 410 may be part of different blocks 452, 454. Each block of memory cells includes NAND strings coupled to same word lines, where NAND strings in different blocks may be coupled to same bit lines. For example, NAND strings in the block 452 are coupled to word lines 446, 448, 440, 442, 444, 450, where NAND strings in different blocks are coupled to bit lines 402, 404, 406, 408. In other embodiments, a block of memory cells includes NAND strings coupled to different word lines. Although NAND strings 410 are shown in FIG. 4, in other embodiments, memory cells with different architecture (e.g., NOR) may be implemented.

The NAND strings 410 may be part of the memory device 102 of FIG. 1. Each NAND string may include memory cells 200 of FIG. 2. In particular, each NAND string includes memory cells 460 coupled in series between a corresponding bit line (e.g., bit line 402, 404, 406, or 408) and a reference voltage rail (e.g., ground rail). In this structure, each NAND string includes a plurality of memory cells, where each memory cell may be programmed to store multiple levels of bits. By having multiple memory cells in series in each NAND string, an amount of data stored by each NAND string can be improved compared to having a single memory cell in each NAND string. In other embodiments, different numbers of memory cells are included in each NAND string.

Figure 5:
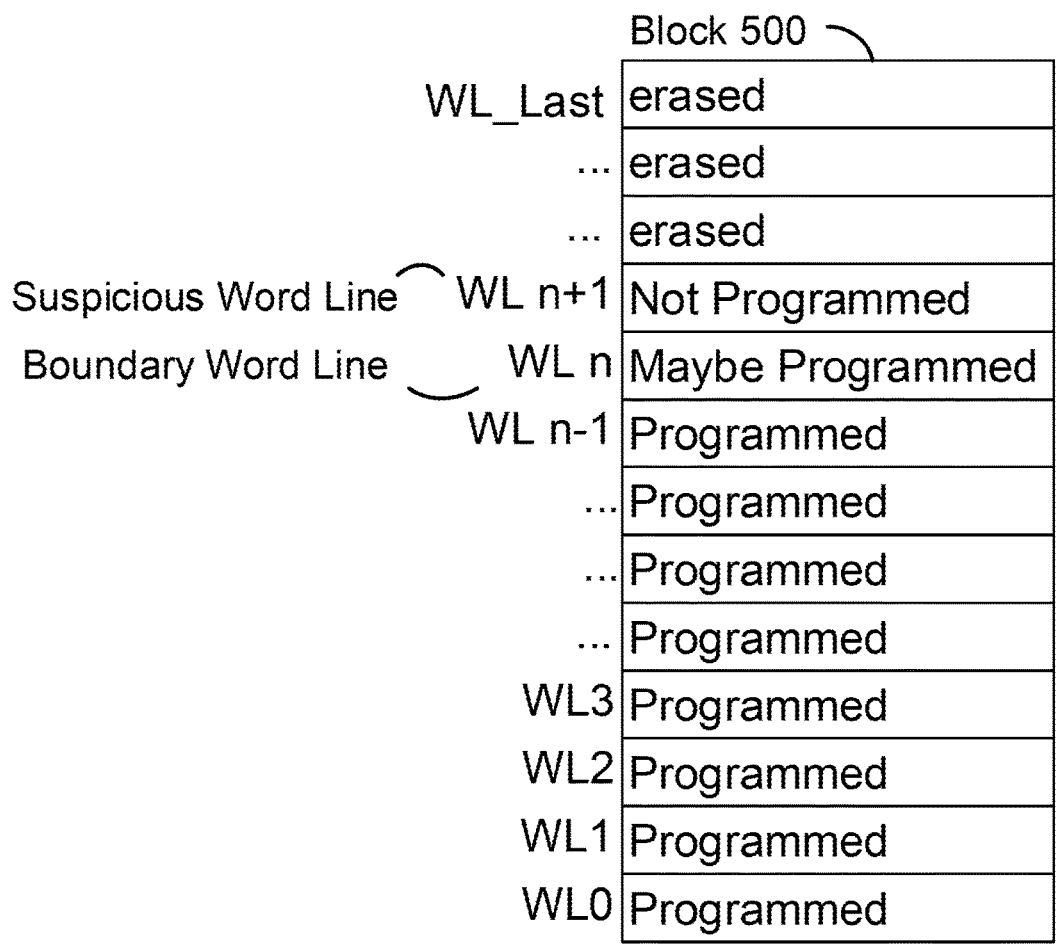
FIG. 5 shows a block of memory cells according to an example embodiment.

Referring to FIG. 5, illustrated is a block 500 of memory cells according to an example embodiment. The block 500 of memory cells may correspond to the block 452 or the block 454 shown in FIG. 4. In one approach, data is written in an ascending order from memory cells coupled to a word line WL0 to a word line WL_Last. While writing data to or retrieving data from memory cells coupled to a word line WLn, an unexpected power loss may occur or a system may shut down without a proper sequence, rendering data stored by the block 500 of memory cells to be uncertain. In one aspect, the control circuit 150 determines a boundary word line and a suspicious word line to predict whether data stored by the block 500 of memory cells is correct or not. A boundary word line is a word line coupled to memory cells that are predicted to store correct data, where the memory cells are adjacent to other memory cells storing incorrect data or other memory cells not storing any data. A suspicious word line is a word line coupled to memory cells not storing data or storing incorrect data, where the memory cells are adjacent to other memory cells coupled to the boundary word line. In one aspect, the control circuit 150 determines a level of uncertainty of data stored by memory cells coupled to the suspicious word line, and allocates storage resource of the block 500 of memory cells according to the determined level of uncertainty. A detailed process of detecting a boundary word line and a suspicious word line, and determining an uncertainty of data stored by memory cells coupled to the suspicious word line are provided below with respect to FIGS. 6 through 10.

Figure 6:
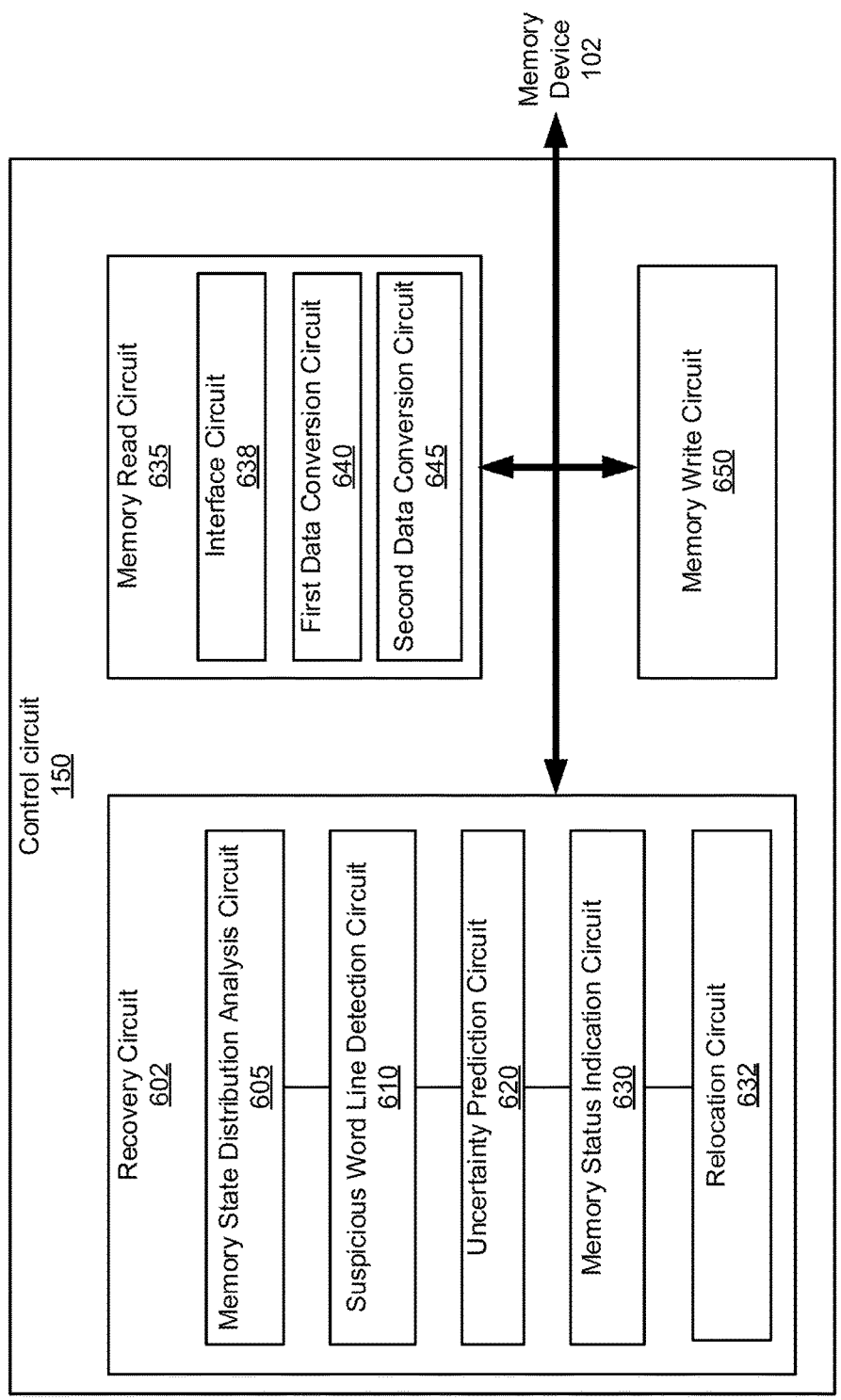
FIG. 6 illustrates an example control circuit according to an example embodiment.

Referring to FIG. 6, illustrated is a control circuit 150, according to an example embodiment. In one embodiment, the control circuit 150 includes a recovery circuit 602, a memory read circuit 635, and a memory write circuit 650. These components operate together to determine whether a block of memory cells are operable, and read data from or write data to the block of memory cells. In other embodiments, the control circuit 150 includes more, fewer, or different components than shown in FIG. 6.

The recovery circuit 602 is a circuit that determines whether a block of memory cells or a subset (e.g., row) of memory cells is operational, for example, after an unexpected power shut down or after unexpected interrupts in the operations of the memory device. In one embodiment, the recovery circuit 602 includes a memory state distribution analysis circuit 605, a suspicious word line detection circuit 610, an uncertainty prediction circuit 620, a memory status indication circuit 630, and a relocation circuit 632. These components operate together to determine a level of uncertainty of programmed states of a block of memory cells in the memory device 102 and generate status indicators according to the determined level of uncertainty. In other embodiments, the recovery circuit 602 includes more, fewer, or different components than shown in FIG. 6.

The memory state distribution analysis circuit 605 is a circuit that determines a distribution of programmed states of memory cells coupled to a word line. The memory state distribution analysis circuit 605 may be coupled to word lines of different memory cells. In one approach, the memory state distribution analysis circuit 605 obtains a distribution of memory states programmed in memory cells coupled to a word line by applying voltages to the memory cells. The memory state distribution analysis circuit 605 may cause a word line controller (not shown) to apply a voltage to a selected word line, and cause a bit line controller (not shown) to apply corresponding voltages to bit lines to verify programmed states. The memory state distribution analysis circuit 605 also senses voltages or currents from the memory cells coupled to the word line in response to the applied voltages. Moreover, the memory state distribution analysis circuit 605 determines programmed threshold voltages of the memory cells coupled to the word line corresponding to the sensed voltages or currents, and obtains a distribution of the programmed states of the memory cells according to the determined threshold voltages. The obtained distribution of the programmed states of the memory cells may be provided to the suspicious word line detection circuit 610, the uncertainty prediction circuit 620, or both. Examples of distribution of programmed states are shown below with respect to FIGS. 9A through 9C and FIG. 10.

The suspicious word line detection circuit 610 is a circuit that detects a boundary word line and a suspicious word line of a block of memory cells. The suspicious word line detection circuit 610 is coupled to the memory state distribution analysis circuit 605. In one approach, the suspicious word line detection circuit 610 receives distributions of programmed states of memory cells of two or more word lines from the memory state distribution analysis circuit 605, and detects a boundary word line and a suspicious word line by comparing the received distributions of programmed states of memory cells. In one approach, if a first distribution of the programmed states of memory cells coupled to a word line WLn is substantially equal to a predetermined distribution and if a second distribution of the programmed states of memory cells coupled to a subsequent word line WLn+1 is different from the predetermined distribution, then the suspicious word line detection circuit 610 determines that the word line WLn is the boundary word line and the subsequent word line WLn+1 is the suspicious word line. The suspicious word line detection circuit 610 may sequentially compare distributions of memory cells coupled to two word lines in an ascending order (i.e., from WL0 to WLn−1) or through a binary search sequence until the boundary word line and the suspicious word line are detected.

The uncertainty prediction circuit 620 predicts a level of uncertainty of programmed states of memory cells. The uncertainty prediction circuit 620 is coupled to the suspicious word line detection circuit 610 and the memory state distribution analysis circuit 605. In one approach, the uncertainty prediction circuit 620 receives programmed states of the memory cells coupled to the suspicious word line, and predicts a level of uncertainty of the programmed states of the memory cells. The uncertainty prediction circuit 620 may predict the uncertainty of the programmed states of memory cells coupled to the suspicious word line by counting a number of predetermined states (e.g., erased state) from the programmed states of the memory cells coupled to the suspicious word line. For example, if the number of the predetermined bits does not satisfy a first threshold number (e.g., less than 10% of the total number of the memory cells coupled to the suspicious word line), then the uncertainty prediction circuit 620 determines that the memory cells coupled to the suspicious word line is predicted to store correct data. If the number of the predetermined bits satisfies the first threshold number but not a second threshold number higher than the first threshold number (e.g., between 10% and 20% of the total number of the memory cells coupled to the suspicious word line), then the uncertainty prediction circuit 620 determines that the memory cells coupled to the suspicious word line have a first level of uncertainty of storing correct data. If the number of the predetermined bits satisfies the second threshold number but not a third threshold number higher than the second threshold number (e.g., between 20% and 30% of the total number of the memory cells coupled to the suspicious word line), then the uncertainty prediction circuit 620 determines that the memory cells coupled to the suspicious word line have a second level of uncertainty of storing correct data higher than the first level of uncertainty. If the number of the predetermined bits satisfies the third threshold number (e.g., larger than 30% of the total number of the memory cells coupled to the suspicious word line), then the uncertainty prediction circuit 620 determines that a block of memory cells including the memory cells coupled to the suspicious word line is inoperable. The first threshold number, the second threshold number, and the third threshold number may be empirically determined by testing a number of memory devices prior to deployment. The uncertainty prediction circuit 620 may provide the determined uncertainty level to the memory status indication circuit 630, the relocation circuit 632, or any combination of them to perform corresponding storage resource allocation.

The memory status indication circuit 630 is a circuit that generates a status indicator for memory cells in a block. In one approach, the memory status indication circuit 630 generates an indicator that indicates which word line is a suspicious word line or which word line is a boundary word line. Additionally, the memory status indication circuit 630 generates an indicator that indicates a level of uncertainty of the block of the memory cells storing correct data. The indicators may be stored by a local storage (e.g., ROM 122, RAM 130, register, etc.). According to the level of the uncertainty as indicated by the indicator, storage resource of the memory device 102 can be allocated or memory read/write operation can be performed.

In one example, the memory status indication circuit 630 generates a clear indicator indicating that the block of memory cells stores correct data, in response to determining that the memory cells coupled to the suspicious word line are predicted to store correct data. In another example, the memory status indication circuit 630 generates a first level uncertainty indicator, in response to determining that the memory cells coupled to the suspicious word line are associated with a first level of uncertainty of storing correct data. The first level uncertainty indicator indicates that the block of memory cells may be still operable but a first data conversion should be performed on the memory cells coupled to the suspicious word line to read data stored by the memory cell coupled to the suspicious word line. In another example, the memory status indication circuit 630 generates a second level uncertainty indicator, in response to determining that the memory cells coupled to the suspicious word line are associated with a second level of uncertainty of storing correct data. The second level of uncertainty may be higher than the first level of uncertainty. The second level uncertainty indicator indicates that the block of memory cells may be still operable but a second data conversion should be performed on the memory cells coupled to the suspicious word line to read data stored by the memory cells coupled to the suspicious word line. Data stored by memory cells coupled to word lines (e.g., WL0~WLn) preceding the suspicious word line may be accessed without any conversion, in response to the first level uncertainty indicator or the second level uncertainty indicator. Moreover, additional data may be stored by memory cells coupled to word lines (e.g., WLn+2~WL_Last) after the suspicious word line, in response to the first level uncertainty indicator or the second level uncertainty indicator. In another example, the memory status indication circuit 630 generates a cease indicator, in response to determining that memory cells in the block are predicted to be inoperable. The cease indicator indicates that the block of memory cells may be inoperable.

The relocation circuit 632 is a circuit coupled to the memory status indicator circuit 630 that relocates data stored by a block of memory cells, according to an indicator generated by the memory status indication circuit 630. In response to the cease indicator, the relocation circuit 632 relocates data stored by memory cells coupled to word lines (e.g., word lines WL0~WLn) preceding the suspicious word line to another block of memory cells. The relocation circuit 632 may disregard the data stored by memory cells coupled to the suspicious word line. Thus, data that is predicted to be correct can be stored and accessed by a different block of memory cells. The relocation circuit 632 then may preclude the entire block of memory cells indicated with the cease indicator from further use, until the entire block of memory cells associated with the cease indicator is reset.

The memory read circuit 635 is a circuit coupled between the host system 112 and the memory device 102 for reading data stored by memory cells in the memory device 102. In some embodiments, the memory read circuit 635 includes an interface circuit 638, a first data conversion circuit 640 and the second data conversion circuit 645. These components operate together to receive a request to read data stored by a memory cell, and read data stored by the memory cell according to a status indicator generated by the memory status indication circuit 630. In some embodiments, the memory read circuit 635 includes more, fewer, or different components than shown in FIG. 6.

The interface circuit 638 is a circuit coupled between the host system 112 and the memory device 102. In one aspect, the interface circuit 638 receives a request to retrieve data stored by target memory cells (e.g., a row of memory cells) identified by a particular address. The interface circuit 638 obtains a status indicator associated with the memory cells, and outputs data to the host system 112, according to the status indicator. In response to a clear indicator, the interface circuit 638 may retrieve data stored by the target memory cells, and provide the retrieved data without the data conversion performed by the first data conversion circuit 640 and the second data conversion circuit 645. The interface circuit 638 may perform data conversion on a portion of the retrieved data stored, and provide the converted data, in response to a first level uncertainty indicator or a second level uncertainty indicator. For example, the interface circuit 638 retrieves and provides data stored by memory cells coupled to word lines (e.g., WL1~WLn) preceding the suspicious word line having a first level uncertainty indicator or a second level uncertainty indicator. The interface circuit 638 may perform a first data conversion or a second data conversion on data stored by memory cells coupled to the suspicious word line (e.g., WLn+1) having a first level uncertainty indicator or a second level uncertainty indicator, and output the converted data to the host system 112.

The first data conversion circuit 640 is a circuit that performs a first data conversion on a portion of data stored by memory cells. Responsive to the interface circuit 638 instructing to retrieve data stored by memory cells coupled to a suspicious word line having a first level uncertainty indicator, the first data conversion circuit 640 performs, for each memory cell of the memory cells coupled to the suspicious word line, an XOR operation (or XNOR operation) on an upper page data and a middle page data to substitute a lower page data. In one aspect, the lower page data is more likely to be affected by unexpected power shutdown than the upper page data and the middle page data. The interface circuit 638 may provide the middle page data and the upper page data to the host system 112 without any conversion.

The second data conversion circuit 645 is a circuit that performs a second data conversion on a portion of data stored by memory cells. Responsive to the interface circuit 638 instructing to retrieve data stored by memory cells coupled to a suspicious word line having a second level uncertainty indicator, the second data conversion circuit 645 resets a lower page data, for each memory cell of the memory cells coupled to the suspicious word line. The interface circuit 638 may provide the middle page data and the upper page data to the host system 112 without any conversion. When resetting data, data may not be programmed, or programming may be skipped for the reset page.

The memory write circuit 650 is a circuit coupled between the host system 112 and the memory device 102 that stores data from the host system 112 at the memory device 102 according to the status indicator. In one approach, the memory write circuit 650 writes data at a block of memory cells having a clear indicator, a first uncertainty level indicator, or a second uncertainty level indicator. That is, the memory write circuit 650 may write data at memory cells coupled to word lines (e.g., WLn+2~WL_Last) after the suspicious word line, in response to the first uncertainty level indicator or the second uncertainty level indicator of the suspicious word line. The memory write circuit 650 may overwrite data stored by memory cells coupled to word lines (e.g., WL1~WLn) preceding the suspicious word line or the suspicious word line (e.g., WLn+1). In response to the cease indicator, the memory write circuit 650 may not store data on the block of memory cells, until the cease indicator is removed, for example, by resetting data stored by the block of memory cells.

In one or more embodiments, the memory state distribution analysis circuit 605 is means for obtaining a first distribution of memory states of a first subset of memory cells coupled to a first word line and a second distribution of memory states of a second subset of memory cells coupled to a second word line. In one or more embodiments, the suspicious word line detection circuit 610 is means for determining a suspicious word line by comparing the first distribution and the second distribution. In one or more embodiments, the uncertainty prediction circuit 620 is means for determining a level of uncertainty of programmed states of the second subset of the memory cells coupled to the second word line based on the programmed states of the second subset of the memory cells. In one or more embodiments, the memory status indication circuit 630 is means for generating a status indicator indicating that an adjacent subset of the memory cells is programmable, in response to a determination that the level of the uncertainty of the programmed states of the second subset of the memory cells is between a first threshold and a second threshold.

In one or more embodiments, the first data conversion circuit 640 is means for applying a data conversion to the second subset of the memory cells, in response to a determination that the level of the uncertainty of the programmed states of the second subset of the memory cells is between the first threshold and the second threshold. In one or more embodiments, the second data conversion circuit 645 is means for applying a different data conversion to the second subset of the memory cells, in response to a determination that the level of the uncertainty of the programmed states of the second subset of the memory cells is between the second threshold and a third threshold.

Figure 7:
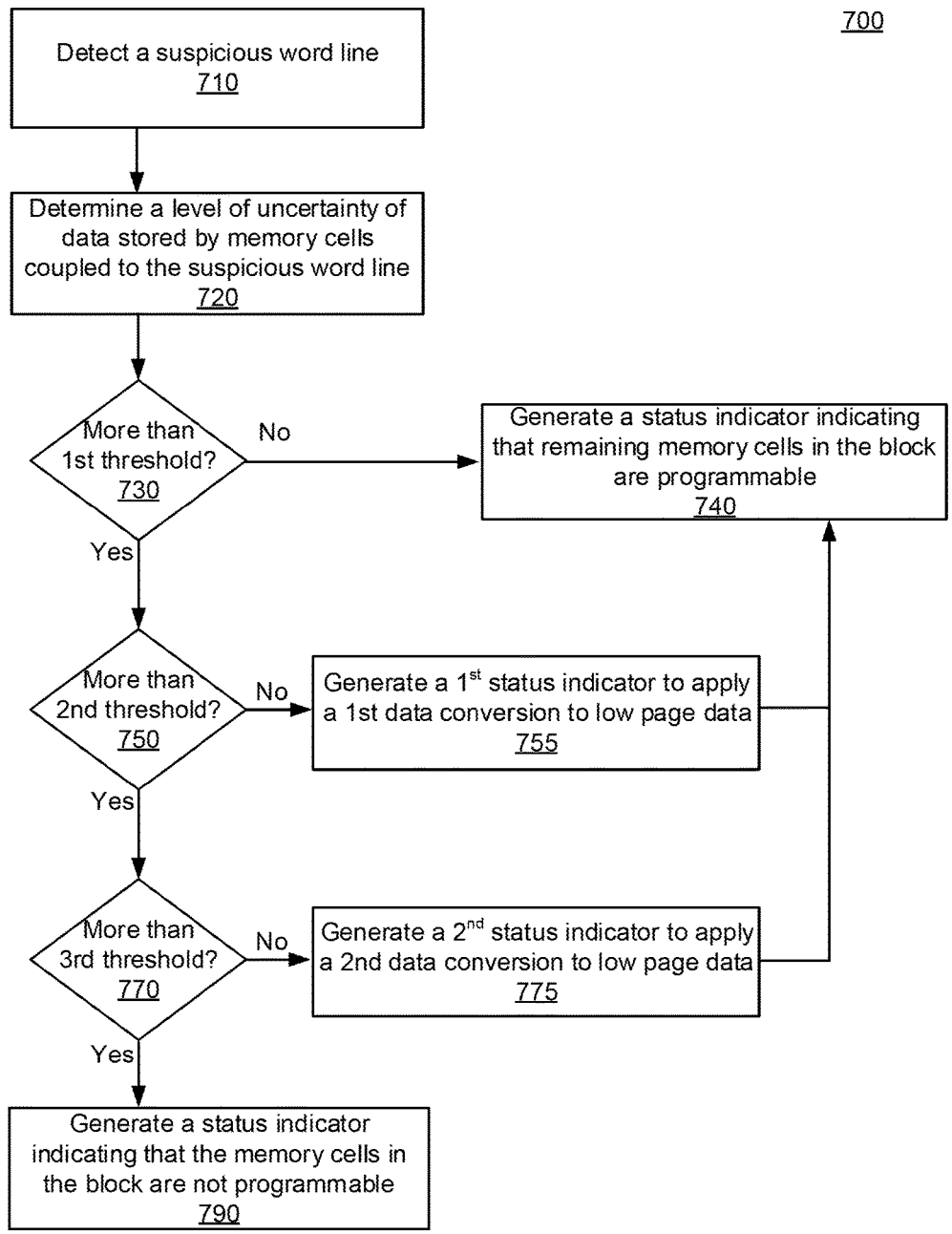
FIG. 7 is a flow chart illustrating a process of predicting a level of uncertainty of data stored by memory cells according to an example embodiment.

FIG. 7 is a flow chart illustrating a process 700 of predicting a level of uncertainty of data stored by memory cells, according to an example embodiment. The process 700 may be performed by the control circuit 150 (e.g., recovery circuit 602 of FIG. 6). The process 700 may be performed, for example, in response to an unexpected power shut down or after unexpected interrupts in the operations of the memory device. In other embodiments, the process 700 may be performed by other entities. In other embodiments, the process 700 includes more, fewer, or different operations than shown in FIG. 7.

The control circuit 150 detects a suspicious word line and a boundary word line in an operation 710. A boundary word line is a word line coupled to memory cells that are predicted to store correct data, where the memory cells are adjacent to other memory cells storing incorrect data or other memory cells not storing any data. A suspicious word line is a word line coupled to memory cells not storing data or storing incorrect data, where the memory cells are adjacent to other memory cells coupled to the boundary word line. In one approach, the control circuit 150 obtains distributions of memory states programmed in memory cells coupled to two adjacent word lines and compares the distributions of programmed states of memory cells to detect the suspicious word line and the boundary word line. For example, if a first distribution of the programmed states of memory cells coupled to a word line WLn is substantially equal to a predetermined distribution and if a second distribution of the programmed states of memory cells coupled to a subsequent word line WLn+1 is different from the predetermined distribution, then the control circuit 150 determines that the word line WLn is the boundary word line and the subsequent word line WLn+1 is the suspicious word line.

In an operation 720, the control circuit 150 determines a level of uncertainty of data stored by memory cells coupled to the suspicious word line. In one approach, the control circuit 150 determines the level of the uncertainty by counting a number of predetermined bits (e.g., bits corresponding to an erased state) from the programmed states of the memory cells coupled to the suspicious word line. The control circuit 150 may count a number of memory cells coupled to the suspicious word line having threshold voltages less than a predetermined voltage (e.g., 0V) to count a number of predetermined bits having an erased state. In one aspect, the number of predetermined bits stored by memory cells coupled to the suspicious word line corresponds to a level of uncertainty of data stored by the memory cells in the block.

The control circuit 150 determines whether the level of the uncertainty satisfies a first threshold in an operation 730. For example, the control circuit 150 determines whether the number of predetermined bits (e.g., erased state) from the programmed states of the memory cells coupled to the suspicious word line is larger than a first threshold number (e.g., more than 10% of the total number of memory cells coupled to the suspicious word line).

In response to determining that the level of the uncertainty does not satisfy the first threshold (e.g., the number of predetermined bits (e.g., erased state) is less than 10% of the total number of memory cells coupled to the suspicious word line), the control circuit 150 generates a status indicator indicating that remaining memory cells in the block coupled to word lines preceding and succeeding the suspicious word line are programmable in an operation 740. Data stored by memory cells coupled to the suspicious word line may be accessed without any conversion or modification.

In response to determining that the level of the uncertainty satisfying the first threshold (e.g., the number of predetermined bits (e.g., erased state) is higher than the first threshold number), the control circuit 150 determines whether the level of the uncertainty satisfies a second threshold in an operation 750. For example, the control circuit 150 determines whether the number of predetermined bits (e.g., erased state) from the programmed states of the memory cells coupled to the suspicious word line is larger than a second threshold number (e.g., 20% of the total number of memory cells coupled to the suspicious word line) higher than the first threshold number.

In response to determining that the level of the uncertainty does not satisfy the second threshold (e.g., the number of predetermined bits (e.g., erased state) is higher than the first threshold number but less than the second threshold number), the control circuit 150 generates a status indicator (e.g., a first level uncertainty indicator) indicating to apply a first data conversion to lower page data in an operation 755 to read data stored by memory cells coupled to the suspicious word line. When reading data stored by memory cells coupled to the suspicious word line, the control circuit 150 may perform, for each memory cell coupled to the suspicious word line, an XOR operation on an upper page data and a middle page data to substitute a lower page data, in response to the first level uncertainty indicator. Moreover, in the operation 740, the control circuit 150 generates a status indicator indicating that remaining memory cells in the block coupled to word lines preceding (e.g., WL1~WLn) and succeeding (e.g., WLn+2~WL_Last) the suspicious word line (e.g., WLn+1) are programmable.

In response to determining that the level of the uncertainty satisfying the second threshold (e.g., the number of predetermined bits (e.g., erased state) is higher than the second threshold number), the control circuit 150 determines whether the level of the uncertainty satisfies a third threshold in an operation 770. For example, the control circuit 150 determines whether the number of predetermined bits (e.g., erased state) from the programmed states of the memory cells coupled to the suspicious word line is larger than a third threshold number (e.g., 30% of the total number of memory cells coupled to the suspicious word line) higher than the second threshold number. The first threshold number, the second threshold number, and the third threshold number may be empirically determined by testing a number of memory devices prior to deployment.

In response to determining that the level of the uncertainty does not satisfy the third threshold (e.g., the number of predetermined bits (e.g., erased state) is higher than the second threshold number but less than the third threshold number), the control circuit 150 generates a status indicator (e.g., a second level uncertainty indicator) indicating to apply a second data conversion to lower page data in an operation 775 to read data stored by memory cells coupled to the suspicious word line. When reading data stored by memory cells coupled to the suspicious word line, the second data conversion circuit 645 may reset the lower page data, for each memory cell coupled to the suspicious word line, in response to the second level uncertainty indicator. Moreover, the control circuit 150 generates a status indicator indicating that remaining memory cells in the block coupled to word lines preceding and succeeding the suspicious word line are programmable in the operation 740.

In response to determining that the level of the uncertainty satisfying the third threshold (e.g., the number of predetermined bits (e.g., erased state) is higher than the third threshold number), the control circuit 150 may generate a status indicator (e.g., a cease indicator) indicating that the memory cells in the block are not programmable in an operation 790. The cease indicator indicates that the block of memory cells may be inoperable. In response to the cease indicator, the control circuit 150 may relocate data stored by memory cells coupled to word lines (e.g., word lines WL0~WLn) preceding the suspicious word line to another block of memory cells. Moreover, the control circuit 150 may preclude the entire block of memory cells indicated with the cease indicator from further use. Additionally or alternatively, the control circuit 150 may reset the entire block of memory cells associated with the cease indicator. In some embodiments, in response to determining that the level of the uncertainty satisfying the third threshold, the control circuit 150 may generate a status indicator indicating that only the memory cells coupled to the suspicious word line are not programmable.

Figure 8:
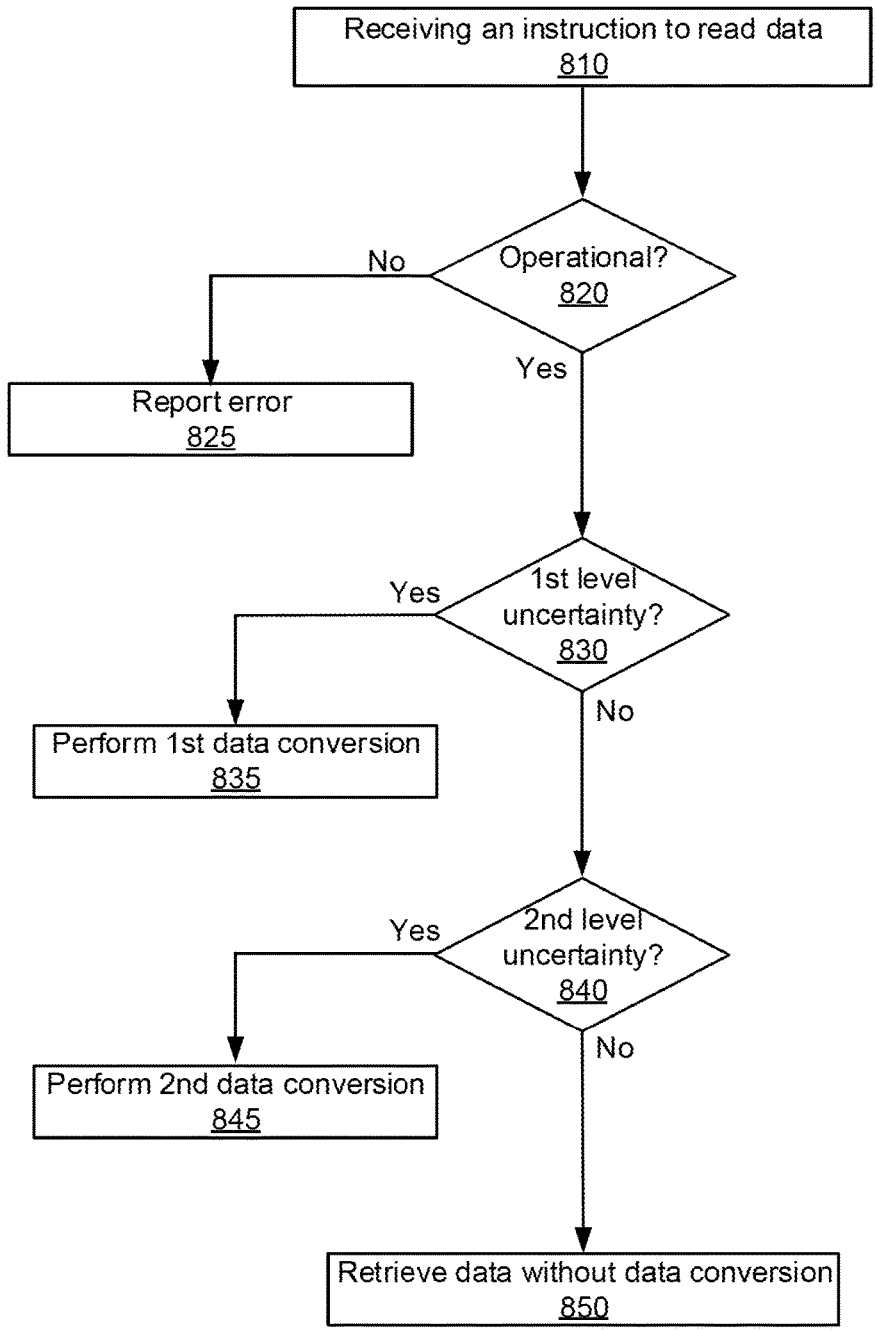
FIG. 8 is a flow chart illustrating a process of reading data stored by memory cells according to an example embodiment.

FIG. 8 is a flow chart illustrating a process 800 of reading data stored by memory cells according to an example embodiment. The process 800 may be performed by the control circuit 150 (e.g., memory read circuit 635) of FIG. 6. In one aspect, the process 800 is performed based on status indicators of a block of memory cells. In other embodiments, the process 800 may be performed by other entities. In other embodiments, the process 800 includes more, fewer, or different operations than shown in FIG. 8. In other embodiments, the process 800 may be performed in a different sequence.

The control circuit 150 receives an instruction to read data in an operation 810. The control circuit 150 may receive a request to read data and address of memory cells from the host system 112. In response to the request in an operation 820, the control circuit 150 determines whether the block of memory cells is operational or not based on a status indicator of the block of memory cells. If the status indicator is a cease indicator of the block of memory cells, the control circuit 150 reports an error to the host system 112 indicating that the block of memory cells is not operational in an operation 825. If data stored by the block of memory cells is relocated to a different block of memory cells by the relocation circuit 632, the control circuit 150 may retrieve the requested data from the different block of memory cells and provide the retrieved data to the host system 112. If the status indicator is one of the first level uncertainty indicator, the second level uncertainty indicator, and the clear indicator, then the control circuit 150 determines that the memory cells are operational.

In an operation 830, the control circuit 150 determines whether a status indicator of a suspicious word line is a first level uncertainty indicator or not. If the control circuit 150 determines that the block of memory cells is operational and if the control circuit 150 detects the first level uncertainty indicator, then the control circuit 150 performs a first data conversion on a portion of the memory cells in an operation 835. The control circuit 150 may perform, for each memory cell of the memory cells coupled to the suspicious word line, an XOR operation on an upper page data and a middle page data to substitute a lower page data. The control circuit 150 may provide the converted data to the host system 112 for the lower page data. The control circuit 150 may provide the middle page data and the upper page data without any conversion.

If the control circuit 150 determines that the block of memory cells is operational and the status indicator is not the first level uncertainty indicator, then the control circuit 150 may determine whether the status indicator is the second level uncertainty indicator in an operation 840. If the control circuit 150 detects the second level uncertainty indicator, then the control circuit 150 performs a second data conversion on a portion of the memory cells in an operation 845. The control circuit 150 may reset a lower page data, for each memory cell of the memory cells coupled to the suspicious word line. The control circuit 150 may provide the reset data to the host system 112 for the lower page data. The control circuit 150 may provide the middle page data and the upper page data without any conversion.

If the control circuit 150 determines that the block of memory cells is operational and if the control circuit 150 detects the clear indicator, the control circuit 150 retrieves data stored by the memory cells, and provides the retrieved data to the host system 112 without any conversion in an operation 850.

Figure 9A:
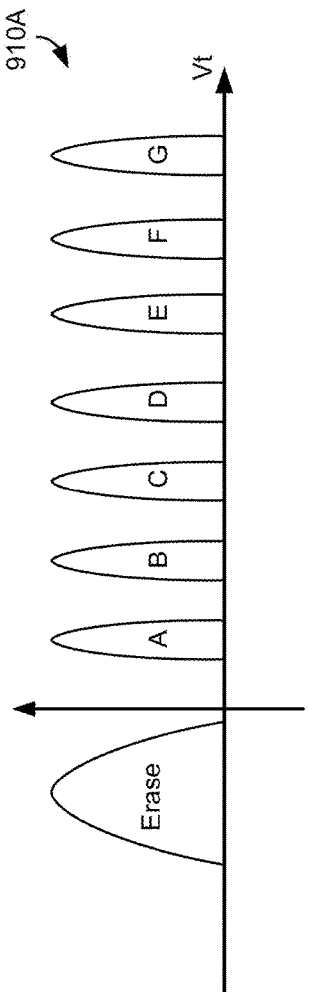
FIGS. 9A through 9C are example distributions of threshold voltages of memory cells according to an example embodiment.
Figure 9B:
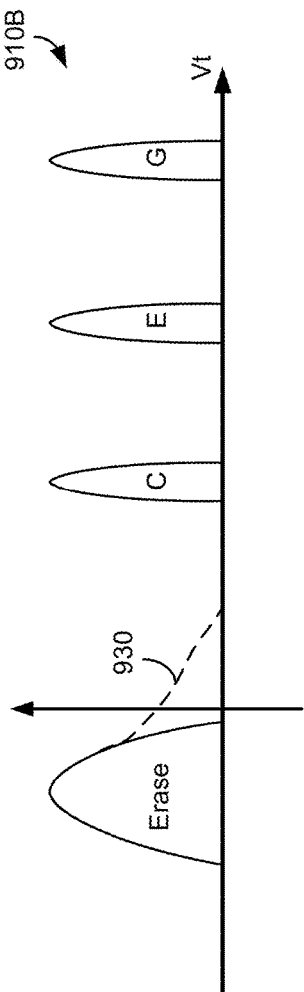
Figure 9C:
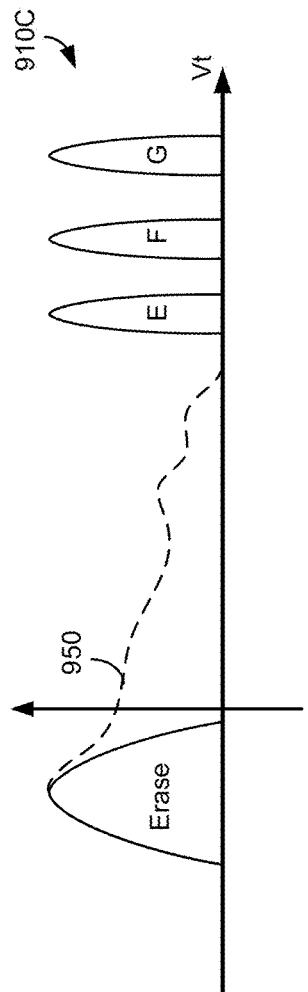
Figure 10:
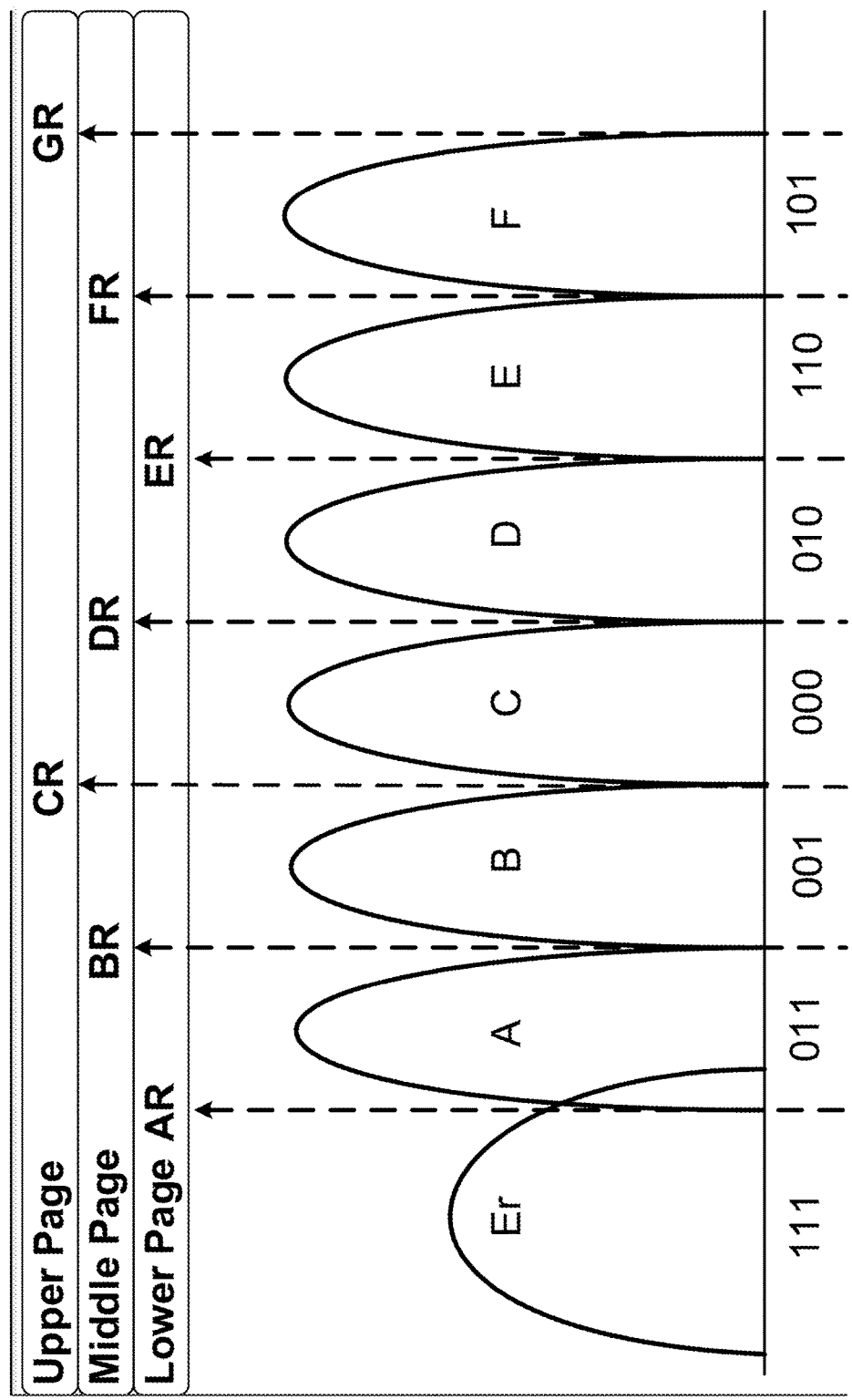
FIG. 10 is another example distribution of threshold voltages of memory cells according to an example embodiment.

FIGS. 9A through 9C are example distributions of threshold voltages (or distributions of memory states) of memory cells according to an example embodiment. FIG. 9A illustrates an example of predetermined distribution 910A of threshold voltages of memory cells coupled to a word line. Assuming that each memory cell stores three page data (e.g., upper page data, middle page data, and lower page data), threshold voltages of memory cells are distributed to have disparate eight different memory states as shown in FIG. 9A. If each state is represented as upper page data, middle page data, and lower page data in that sequence, then eight states including an erase state, and states "A", "B", "C", "D", "E", "F", "G" may be represented as "111", "110", "100", "000", "010", "011", "001", "101", respectively. Similarly, if each state is represented as lower page data, middle page data, and upper page data in that sequence, then eight states can be represented as shown in FIG. 10. Although triple level cell programming are shown in FIGS. 9A through 9C and FIG. 10, similar principle disclosed herein can be applied to quadruple level cell programming or programming of any number of levels.

The predetermined distribution 910A of threshold voltages may be used as a basis of detecting a border word line and a suspicious word line. For example, if a distribution of programmed threshold voltages of memory cells coupled to a word line is substantially equal to the predetermined distribution 910A and if a distribution of programmed threshold voltages of memory cells coupled to a subsequent word line is different from the predetermined distribution 910A, the control circuit 150 determines that the word line is the boundary word line and the subsequent word line is the suspicious word line.

In some cases, the distribution 930 of threshold voltages of memory cells coupled to a suspicious word line may be as shown in FIG. 9B, for example, due to unexpected power loss, abnormal shutdown of a computing device, or aging of a memory device. In this case, the number of predetermined bits (e.g., erased state) is larger than the number of predetermined bits in the distribution 910A. If the number of predetermined bits (e.g., erased state) is larger than a first threshold number but less than a second threshold number, then the control circuit 150 applies a first data conversion when retrieving data stored by the memory cells coupled to the suspicious word line. In one approach, the control circuit 150 performs, for each memory cell coupled to the suspicious word line, an XOR operation on an upper page data and a middle page data to substitute a lower page data, in response to the number of predetermined bits (e.g., erased state) being larger than the first threshold number but less than the second threshold number. After the first data conversion, the distribution 910B of threshold voltages of memory cells coupled to the suspicious word line may become as shown in FIG. 9B.

In some cases, the distribution 950 of threshold voltages of memory cells coupled to a suspicious word line may be as shown in FIG. 9C, for example, due to unexpected power loss, abnormal shutdown of a computing device, or aging of a memory device. In this case, the number of predetermined bits (e.g., erased state) is larger than the number of predetermined bits in the distribution 910B. If the number of predetermined bits (e.g., erased state) is larger than a second threshold number but less than a third threshold number, then the control circuit 150 applies a second data conversion when retrieving data stored by the memory cells coupled to the suspicious word line. In one approach, the control circuit 150 resets, for each memory cell coupled to the suspicious word line, the lower page data, in response to the number of predetermined bits (e.g., erased state) being larger than the second threshold number but less than the third threshold number. After the second data conversion, the distribution 910C of threshold voltages of memory cells coupled to the suspicious word line may become as shown in FIG. 9C.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A memory device comprising:
  memory cells;
  an uncertainty prediction circuit coupled to the memory cells, the uncertainty prediction circuit configured to determine, from a subset of the memory cells coupled to a word line, a number of memory cells having a predetermined state; and
  a data conversion circuit coupled to the memory cells, the data conversion circuit configured to apply a data conversion to a portion of data stored by the subset of the memory cells in response to the uncertainty prediction circuit determining that the number of memory cells is between a first threshold and a second threshold.

2. The memory device of claim 1, further comprising an additional data conversion circuit coupled to the memory cells, the additional data conversion circuit configured to:
  apply a different data conversion to the portion of the data stored by the subset of the memory cells, in response to the uncertainty prediction circuit determining that the number of memory cells is between the second threshold and a third threshold.

3. The memory device of claim 1, wherein the predetermined state of a memory cell indicates that the memory cell is erased, the memory device further comprising a memory status indication circuit coupled to the uncertainty prediction circuit, the memory status indication circuit configured to:
  in response to the uncertainty prediction circuit determining that the number of memory cells is less than the first threshold, generate a status indicator indicating that the subset of the memory cells is programmable.

4. The memory device of claim 1, wherein the predetermined state of a memory cell indicates that the memory cell is erased, the memory device further comprising a memory status indication circuit coupled to the uncertainty prediction circuit, the memory status indication circuit configured to:
  in response to the uncertainty prediction circuit determining that the number of memory cells is more than a third threshold, generate a status indicator indicating that the memory cells in a block are not programmable.

5. The memory device of claim 1, wherein each memory cell is configured to store a first page data, a second page data, and a third page data, the portion of the data stored by the subset of the memory cells being the third page data stored by the subset of the memory cells.

6. The memory device of claim 5, wherein the data conversion circuit is further configured to perform, for each memory cell in the subset of the memory cells, an XOR operation on the first page data and the second page data to substitute the third page data of the memory cell.

7. The memory device of claim 5, further comprising an additional data conversion circuit coupled to the memory cells, the additional data conversion circuit configured to:
reset the third page data stored by the subset of the memory cells, in response to the uncertainty prediction circuit determining that the number of memory cells is between the second threshold and a third threshold higher than the second threshold.

8. The memory device of claim 5, further comprising a memory state distribution analysis circuit coupled to the memory cells, the memory state distribution analysis circuit configured to:
determine a distribution of memory states of another subset of the memory cells coupled to another word line, the another subset of the memory cells adjacent to the subset of the memory cells; and
determine another distribution of memory states of the subset of the memory cells coupled to the word line,
wherein the uncertainty prediction circuit is configured to determine, from the subset of the memory cells coupled to the word line, the number of memory cells having the predetermined state, in response to the memory state distribution analysis circuit determining that:
the distribution of the memory states of the another subset of the memory cells is substantially equal to a predetermined distribution, and the another distribution of the memory states of the subset of the memory cells is different from the predetermined distribution.

9. A memory device comprising:
memory cells;
an uncertainty prediction circuit coupled to the memory cells and configured to determine, from a subset of the memory cells coupled to a word line, a number of memory cells having an erased state; and
a data conversion circuit configured to apply a data conversion to a portion of data stored by the subset of the memory cells in response to the uncertainty prediction circuit determining that the number of erased memory cells is between a first threshold and a second threshold.

10. The memory device of claim 9, further comprising an additional data conversion circuit coupled to the memory cells and configured to:
apply a different data conversion to the portion of the data stored by the subset of the memory cells, in response to the uncertainty prediction circuit determining that the number of erased memory cells is between the second threshold and a third threshold.

11. The memory device of claim 9, further comprising a memory status indication circuit coupled to the uncertainty prediction circuit, the memory status indication circuit configured to:
in response to the uncertainty prediction circuit determining that the number of erased memory cells is less than the first threshold, generate a status indicator indicating that the subset of the memory cells is programmable.

12. The memory device of claim 9, further comprising a memory status indication circuit coupled to the uncertainty prediction circuit, the memory status indication circuit configured to:
in response to the uncertainty prediction circuit determining that the number of erased memory cells is more than a third threshold, generate a status indicator indicating that the memory cells in a block are not programmable.

13. The memory device of claim 9, wherein each memory cell is configured to store a first page data, a second page data, and a third page data, the portion of the data stored by the subset of the memory cells being the third page data stored by the subset of the memory cells.

14. The memory device of claim 13, wherein the data conversion circuit is further configured to perform, for each memory cell in the subset of the memory cells, an XOR operation on the first page data and the second page data to substitute the third page data of the memory cell.

15. The memory device of claim 13, further comprising an additional data conversion circuit coupled to the memory cells and configured to:
reset the third page data stored by the subset of the memory cells, in response to the uncertainty prediction circuit determining that the number of erased memory cells is between the second threshold and a third threshold higher than the second threshold.

16. The memory device of claim 13, further comprising a memory state distribution analysis circuit coupled to the memory cells and configured to:
determine a distribution of memory states of another subset of the memory cells coupled to another word line, the another subset of the memory cells adjacent to the subset of the memory cells; and
determine another distribution of memory states of the subset of the memory cells coupled to the word line,
wherein the uncertainty prediction circuit is configured to determine, from the subset of the memory cells coupled to the word line, the number of memory cells having the erased state, in response to the memory state distribution analysis circuit determining that:
the distribution of the memory states of the another subset of the memory cells is substantially equal to a predetermined distribution, and the another distribution of the memory states of the subset of the memory cells is different from the predetermined distribution.

17. A memory device comprising:
memory cells;
means for determining, from a subset of the memory cells coupled to a word line, a number of memory cells having a predetermined state; and
means for applying a data conversion to a portion of data stored by the subset of the memory cells in response to the uncertainty prediction circuit determining that the number of memory cells is between a first threshold and a second threshold.

18. The memory device of claim 17, further comprising:
means for applying a different data conversion to the portion of the data stored by the subset of the memory cells, responsive to the determining means determining that the number of memory cells is between the second threshold and a third threshold.

19. The memory device of claim 17, wherein the predetermined state of a memory cell indicates that the memory cell is erased, the memory device further comprising:
means for generating, responsive to the determining means determining that the number of memory cells is less than the first threshold, a status indicator indicating that the subset of the memory cells is programmable.

20. The memory device of claim 17, wherein the predetermined state of a memory cell indicates that the memory cell is erased, the memory device further comprising:
    means for generating, responsive to the determining means determining that the number of memory cells is more than a third threshold, a status indicator indicating that the memory cells in a block are not programmable.

* * * * *